United States Patent [19]

Aiki et al.

[11] 4,073,676
[45] Feb. 14, 1978

[54] GaAs-GaAlAs SEMICONDUCTOR HAVING A PERIODIC CORRUGATION AT AN INTERFACE

[75] Inventors: Kunio Aiki, Hachioji; Michiharu Nakamura, Nishitama; Junichi Umeda, Hachioji, all of Japan

[73] Assignee: Hitachi, Ltd., Japan

[21] Appl. No.: 550,769

[22] Filed: Feb. 18, 1975

[30] Foreign Application Priority Data

Feb. 18, 1974 Japan .................................. 49-18630

[51] Int. Cl.² ............................................. B01J 17/04
[52] U.S. Cl. .................................... 156/624; 148/1.5; 427/86; 156/DIG. 70
[58] Field of Search ............... 156/605, 606, 621, 622, 156/624; 427/82, 85, 86, 87; 428/163, 538; 148/171, 1.5

[56] References Cited

U.S. PATENT DOCUMENTS

| | | | |
|---|---|---|---|
| 3,565,702 | 2/1971 | Nelson | 156/605 |
| 3,741,825 | 6/1973 | Lockwood et al. | 156/622 |
| 3,897,281 | 7/1975 | Gilbert et al. | 427/87 |
| 3,933,538 | 1/1976 | Akai | 148/171 |
| 3,951,700 | 4/1976 | Beppu | 156/624 |

OTHER PUBLICATIONS

Laser Oscillation by Nakamura et al., in Applied Physics Letters, vol. 23, No. 5, Sept. 1, 1973, pp. 224, 225.
Optically Pumped GaAs by Nakamura et al., in Applied Physics Letters, vol. 22, No. 10, May 15, 1973, pp. 515, 516.

*Primary Examiner*—Norman Yudkoff
*Attorney, Agent, or Firm*—Craig & Antonelli

[57] ABSTRACT

A semiconductor device including a GaAs layer having a periodic corrugation on a surface thereof with a GaAsAl layer disposed on the periodic corrugation is formed by contacting a solution consisting of Ga, Al and As heated at a temperature of about 700° C. to the corrugated surface of the GaAs layer and cooling the solution to a temperature of about 670° C. at a cooling rate of 5° C./min. whereby the periodic corrugation is not transfigured so much.

9 Claims, 13 Drawing Figures

GaAs-GaAlAs SEMICONDUCTOR HAVING A PERIODIC CORRUGATION AT AN INTERFACE

The present invention relates to a method for fabricating a semiconductor device including a semiconductor crystal layer having a periodic corrugation on the surface thereof, and more particularly to a method for fabricating the semiconductor device including a step of epitaxially growing a semiconductor layer on the periodic corrugated surface of the semiconductor crystal.

As is well known in the art, a semiconductor waveguide has such a structure that at least two surfaces thereof adjoin to regions consisting of a material having a different refractive index from that of the waveguide. When, in the structure, a periodic corrugation is applied to at least one of said surfaces, dispersion characteristics determined by a depth and a period of the corrugation can be given to transmission, reflection and scattering of guided wave. This new structure, therefore, has been utilized for new opto-electronic devices, such as grating couplers described in, for example, *Applied Physics Letters*, Vol. 16, Page 523 (1970) and *IEEE Journal of Quantum Electronics*, Vol. QE-9, Page 29 (1973), optical filters described in, for example, *Optics Communications*, Vol. 6, Page 125 (1972) and *Optics Communications*, Vol. 8, Page 5 (1973) and distributed feedback lasers described in, for example, *Applied Physics Letters*, Vol. 22, Page 515 (1973) and *Applied Physics Letters*, Vol. 23, Page 224 (1973). The distributed feedback laser which has a feedback mechanism utilizing Bragg's reflection of guided wave by the periodic corrugation has been especially watched, since it has advantages in a controllability of a wavelength to be generated therefrom and an integration with other semiconductor elements. This distributed feedback laser has a structure such that a surface of a laser active layer is periodically corrugated.

The periodic corrugation of the waveguide should have a period of about $\lambda/2n$ and a depth of about a half of the period, when the effective refractive index of the material for the waveguide is $n$ and the wavelength of a wave to be guided is $\lambda$. For example, when GaAs ($n = 3.6$) is utilized for the material and the wave has a wavelength $\lambda$ of about 8,000 A, the period and the depth of the periodic corrugation should be about 1,200 A and about 600 A, respectively.

For forming a semiconductor layer on a surface of a semiconductor crystal at which a periodic corrugation is formed, a liquid-phase-epitaxy method which is described in, for example, *Metallurgical Transactions*, Vol. 2, Page 795 (1971), *Journal of Applied Physics*, Vol. 43, Page 2817 (1972), *Journal of Crystal Growth*, Vol. 20, Page 13 (1973) and U.S. Pat. No. 3,565,702 has generally been proposed.

This general liquid-phase-epitaxy method for obtaining a semiconductor layer on a surface of a semiconductor crystal, for example GaAlAs layer on GaAs crystal, comprises the steps of preparing a solution including Ga, Al and As, heating the solution at a temperature between about 800° C. and about 950° C., contacting the heated solution to the surface of GaAs crystal, and cooling the solution at a cooling rate of between about 0.5° C./min. and about 5° C./min. This method has been employed to form the semiconductor layer on a periodically corrugated surface of the semiconductor crystal for examining the above-mentioned proposal by the present inventors. As the results of the experiments, it has been found that the general liquid-phase-epitaxy method described above has not been suitable for forming the semiconductor layer on the periodically corrugated surface of the semiconductor crystal, since the periodic corrugation has not been successfully maintained at the interface between the semiconductor layer and the semiconductor crystal.

Therefore, it is an object of the present invention to provide an improved liquid-phase-epitaxy method for forming a semiconductor layer on a periodically corrugated surface of a semiconductor crystal.

It is another object of the present invention to provide an improved liquid-phase-epitaxy method for forming a semiconductor layer on a periodically corrugated surface of a semiconductor crystal, wherein the periodic corrugation is not transfigured at all or so much.

It is a further object of the present invention to provide an improved liquid-phase-epitaxy method for easily and accurately forming a semiconductor layer on a periodically corrugated surface of a semiconductor crystal.

The objects mentioned above are accomplished by controlling a temperature of a solution at which the solution is contacted to a periodically corrugated surface of a semiconductor crystal so as to be lower than the temperature suitable for the general liquid-phase-epitaxy method.

This fact was obtained from results of investigations as to a condition of the temperatures in the general liquid-phase-epitaxy method.

As is well known in the art, when a semiconductor layer is epitaxially grown on a surface of a semiconductor crystal by utilizing the liquid-phase-epitaxy method, the temperature of a solution including elements of the semiconductor layer is cooled at a certain cooling rate for obtaining a supersaturated solution and this supersaturated solution is contacted to the surface of the semiconductor crystal. In the formation of GaAlAs layer on the surface of GaAs crystal, for example, the temperature of the solution at which the solution is contacted to the surface of GaAs is between 800° C and 950° C., as stated before. This temperature for contacting to GaAs is decided by the following reasons:

1. When the contacting temperature is low, the distribution of Al in the epitaxially grown GaAlAs layer does not become uniform;

2. The supersaturated solution can easily be obtained when the contacting temperature is high, since the higher the temperature is, the more the solubility of GaAlAs increases; and 3. It is very difficult to obtain an epitaxial layer of GaAlAs of good quality, when the contacting temperature is higher than 950° C., since GaAs decomposes remarkably at the surface of the crystal.

As is also well known in the art, the surface of the semiconductor crystal melts back temporarily just before the growth of the semiconductor layer, since the supersaturation of the solution being necessary for the epitaxial growth of the semiconductor layer is temporarily lowered because of the existence of a partial temperature distribution in the cooling solution and of the disturbances of the solution caused by the contact with the semiconductor crystal. The higher the temperature of the solution is, the more the quantity of the melt-back of the semiconductor crystal becomes.

The present invention is based on the fact that the solubility in the solution utilized in the liquid-phaseepitaxy method becomes low rapidly according as the temperature of the solution becomes low and hence the melt-back of the semiconductor crystal is very slight.

Other objects, features and advantages of the present invention will be apparent from the following detailed description of some preferred embodiments thereof taken in conjunction with the accompanying drawings wherein like reference numerals are used to denote like parts.

Figure 1:
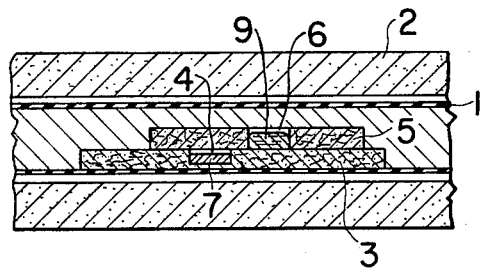
FIGS. 1 and 2 are cross-sectional views of apparatus for explaining the present invention, which are useful in the practice of the present invention.
Figure 2:
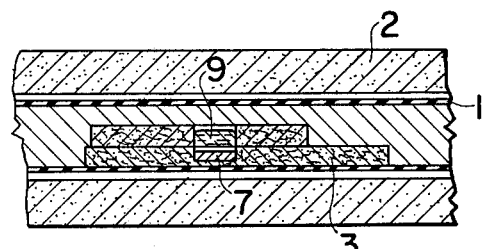

Referring to FIGS. 1 and 2 showing in schematic vertical sections of apparatus useful in the practice of the present invention, in a quartz tube 1 disposed in an electric furnace 2, a graphite boat 3 having a slot 4, on which it is disposed that a graphite slider 5, which is movable along the surface of the graphite boat 3, having a well 6, is disposed. The slot 4 should be large enough to hold a semiconductor crystal 7 and the depth of the slot 4 should be more than the thickness of the semiconductor crystal.

A method for forming $Ga_{1-x}Al_xAs$ layer as GaAs crystal according to the present invention, that it, one embodiment of the present invention, utilizing said apparatus is explained hereinbelow.

Figure 3:
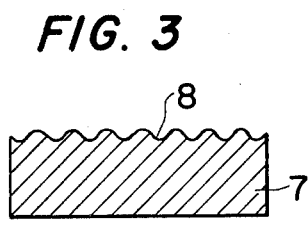
FIG. 3 is a sectional view of a semiconductor crystal having a periodic corrugation at one surface thereof on which a semiconductor layer is grown.

An n-type GaAs crystal 7 (dopant: Te, donor concentration: $5 \times 10^{18}/cm^3$) having a periodic corrugation 8 at one surface thereof, whose cross-section is shown in FIG. 3 is disposed in the slot 4, and in the well 6 which is apart from th slot 4 as shown in FIG. 1, a solution 9 consisting of Ga, Al and As is introduced. The amounts of Ga, Al and As are decided so as to be enough for a composition of a semiconductor layer to be grown on the surface of the semiconductor crystal 7, for example, Ga of 10g, GaAs of 400mg and Al of 6mg for $Ga_{0.7}Al_{0.3}As$, Ga of 10g, GaAs of 400mg and Al of 9mg for $Ga_{0.6}Al_{0.4}As$ and Ga of 10g, GaAs of 400mg and Al of 14mg for $Ga_{0.5}Al_{0.5}As$.

$H_2$ gas is introduced into the quartz tube 1, and then the solution 9 is heated to 710° C. After maintaining this state for about 1 hour, the solution 9 is cooled at a cooling rate of 3° C./min. When the temperature of the solution 9 becomes about 700° C., the graphite slider 5 is slid along the surface of the graphite boat 3 so that the solution 9 in the well 6 contacts the surface of the periodic corrugation 8 of GaAs crystal 7 (FIG. 2). At this stage, a $Ga_{1-x}Al_xAs$ layer begins to grow on the surface of the periodic corrugation 8. The solution 9 is continued to cool at the cooling rate of 3° C. min, and, when the temperature of the solution 9 is 680° C., the solution is melted-off from the surface and a power supplied to the electric furnace 2 is turned off.

Figure 4:
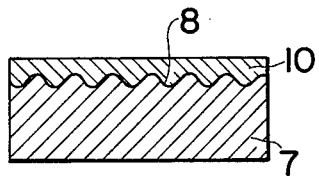
FIG. 4 is a sectional view of a resultant structure obtained according to the method of the present invention.

According to these steps, 1 $Ga_{1-x}Al_xAs$ layer 10 having a thickness of about 3 $\mu$ is obtained on the periodically corrugated surface 8 of GaAs crystal 7 as shown in FIG. 4.

Figure 5:
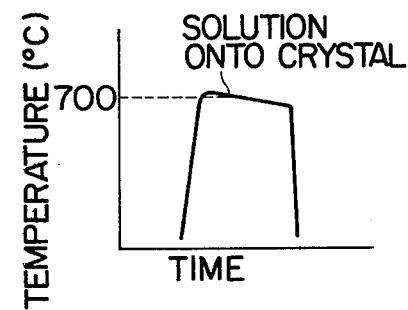
FIG. 5 shows a typical temperature schedule used for obtaining the resultant structure shown in FIG. 4.

A typical temperature schedule used for growth $Ga_{1-x}Al_xAs$ is shown in FIG. 5. In FIG. 5, the vertical axis shows a temperature (° C.) and a horizontal axis shows a time.

Figure 6:
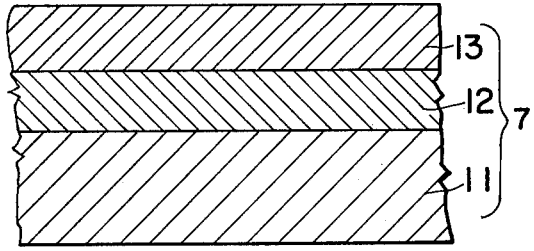
FIGS. 6 to 8 are sectional views for explaining the method of the present invention to obtain a distributed feedback laser.
Figure 7:
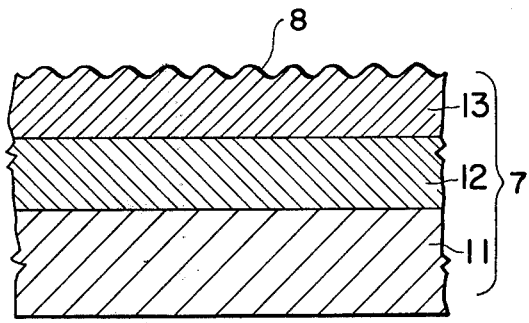
Figure 8:
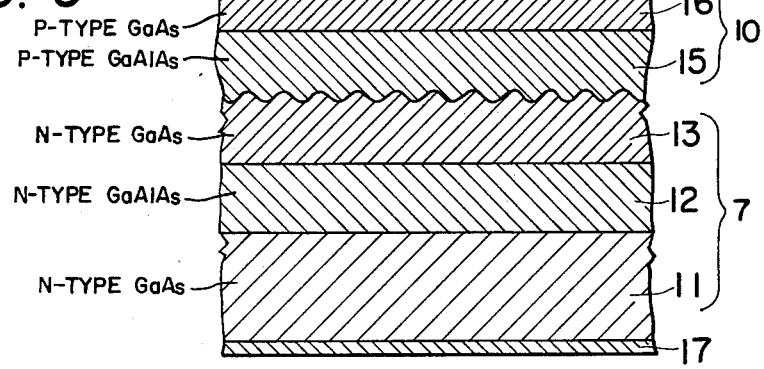

FIGS. 6 to 8 are views for explaining another embodiment of the present invention, which is a method for fabricating a distributed feedback laser.

On an n-type GaAs substrate 11 having a donor concentration of $8 \times 10^{18}/cm^3$, an n-type GaAlAs layer 12 and an n-type GaAs layer 13 are successively formed by a conventional liquid-phase-epitaxy method (FIG. 6). The GaAs layer 13 functions as a laser active layer for this distributed feedback laser. Preferable thicknesses of the GaAlAs layer 12 and the GaAs layer 13 are 2 $\mu$ and 0.5 $\mu$, respectively. On the surface of the GaAs layer 13, a photoresist layer is formed, and ultraviolet laser beams are directed onto said photoresist layer so that interference fringes are formed on the surface of said photoresist layer. When the photoresist layer is developed, a photoresist layer having a periodically corrugated surface is obtained. This technique is described in detail in Applied Optics, Vol. 12, Page 455 (1973). After that, the resultant crystal is introduced into an ion milling machine and is etched by ions, thereby forming a resultant crystal having a periodically corrugated surface 14 on the n-type GaAs layer 13 (FIG. 7). The three layers 11, 12 and 13 thus correspond to the structure of layer 7, shown in FIGS. 3 and 4.

This resultant crystal shown in FIG. 7 is set in the slot 4 shown in FIG. 1, and Ga of 10 g, GaAs of 400 mg, Al of 6 mg and Ge of 200 mg for a dopant are put in the well 6 shown in FIG. 1 for making a solution for p-type GaAlAs layer on the periodically corrugated surface 14 of the GaAs layer 13. Then $H_2$ gas is introduced into the quartz tube 1, and the solution is heated to 700° C. After maintaining this state for about half an hour, the solution is cooled to 690° C. at a cooling rate of 2° C./min, and the graphite slider 5 is slid along the surface of the graphite boat 3 so that the solution in the wall 6 contacts to the periodically corrugated surface 14 of the GaAs layer 13 as shown in FIG. 2. The cooling of the solution is continued at the cooling rate of 2° C./min. for 15 minutes, the solution is melted-off from the surface, and then power supplied to the electric furnace is turned off.

By these steps, a p-type $Ga_{0.7}Al_{0.3}As$ layer 15 having a thickness of 3 $\mu$ is grown on the periodically corrugated surface 14.

For completing the distributed feedback laser, a p-type GaAs layer 16 is grown on the p-type GaAlAs layer 15 by a conventional liquid-phase-epitaxy method, (layers 15 and 16 correspond to the structure of layer 10, shown in FIG. 4) and metal contacts 17 and 18 are formed on the GaAs body 17 and the p-type GaAs layer 16, respectively (FIG. 8).

Though, in the above embodiments, GaAlAs layer is epitaxially grown on the periodically corrugated surface of GaAs crystal, the present invention is applicable to the epitaxial growth of other materials, such as GaAlP and GaAlAsP.

For obtaining a $Ga_{0.6}Al_{0.4}P$ layer on the periodically corrugated surface of GaP crystal; the GaP crystal is set in the slot 4 and Ga of 10 g, GaP of 70 mg and Al of 3 mg are put in the well 6 of the apparatus shown in FIG. 1; $H_2$ gas is introduced into the quartz tube 1; a solution consisting of above-mentioned elements and compound is heated at a temperature of about 820° C.; this heated solution is cooled to 800° C. at a cooling rate of 4° C./min.; then this solution is contacted to the periodically corrugated surface of GaP crystal as shown in FIG. 2; this state is continued until the temperature of the solution becomes 770° C; and the solution is melted-off from the surface and then the power supplied to the electric furnace is turned off.

As is apparent from the above descriptions, most all steps of the present invention are same as those of the aforesaid conventional general liquid-phase-epitaxy method, in other words, most all steps of the general liquid-phase-epitaxy method may be applied to the present invention. A principal point of difference is the temperature range of the solution at which the surface of the semiconductor crystal is contacted thereto. In the present invention, the contacting temperature of the solution to the surface of the semiconductor crystal is lower than the temperature of the solution which is suitable for the conventional general liquid-phase-epitaxy method. That is, the contacting temperature of the present invention is lower than 800° C. for obtaining a GaAlAs layer and lower than 960° C. for obtaining a GaAlP layer, since the contacting temperature range between 800° C. and 950° C. for obtaining GaAlAs layer and the contacting temperature more than 960° C. for obtaining GaAlP layer are utilized in the conventional general liquid-phase-epitaxy method, and since it was very difficult for the present inventors to grow the semiconductor layer on the periodically corrugated surface of the semiconductor crystal so as to retain the corrugation at the temperature utilized in the conventional general liquid-phase-epitaxy method. Preferable contacting temperature ranges for epitaxially grown GaAlAs layer and GaAlP layer on the periodically corrugated surfaces of the GaAs crystal and of the GaP crystal are between 650° C. and 750° C. and 750° C. and 850° C., respectively. The cooling rate of the solution may be same as that of the conventional general liquid-phase-epitaxy method. According to the present inventors' experiments, it is preferable to cool the solution at a cooling rate between 1° C./min and 10° C./min., and it is most preferable to cool the solution at a cooling rate between 1° C./min and 5° C./min.

The effects of the present invention will be apparent from the following description taken in conjunction with FIGS. 9 to 12.

Figure 9:
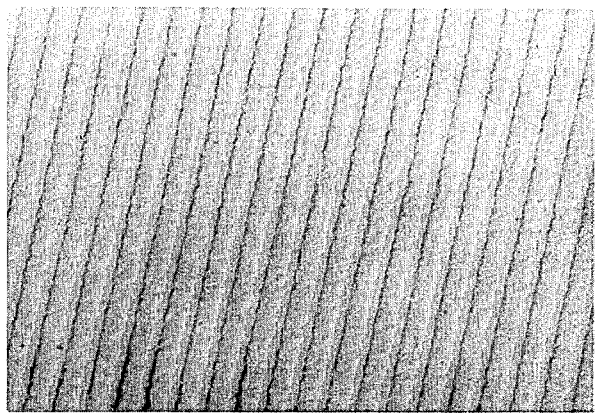
FIGS. 9 to 12 are photomicrographs of the periodically corrugated surface of the semiconductor crystal and of the surfaces of the semiconductor layers obtained by the general liquid-phase-epitaxy method and by the present invention.
Figure 10:
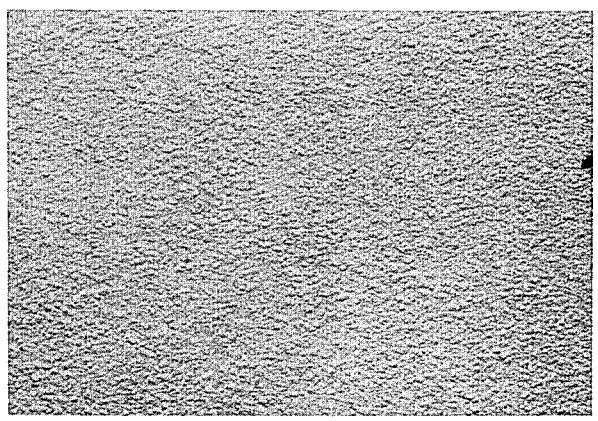
Figure 11:
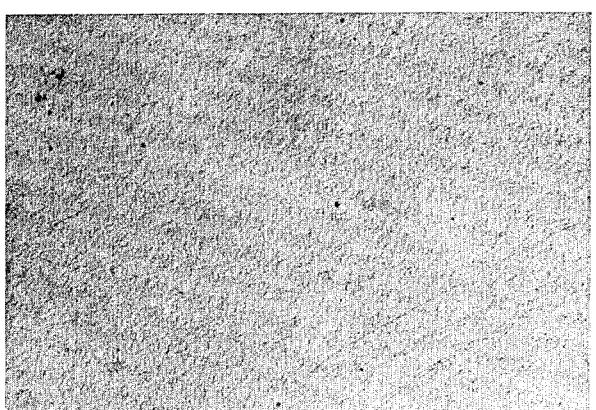
Figure 12:
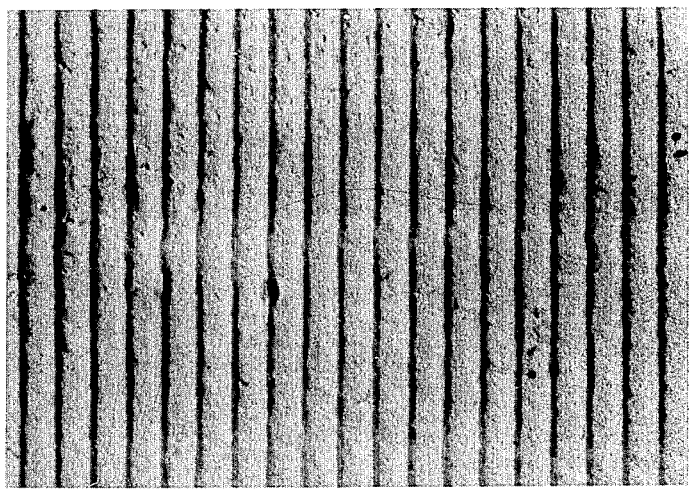

FIG. 9 is a photomicrograph, photographed by a scanning electron microscope, of the periodically corrugated surface of GaAs crystal, FIGS. 10, 11 and 12 are photomicrographs of the surfaces of GaAs crystals after etching GaAlAs layers formed on the periodically corrugated surface of GaAs crystal shown in FIG. 9 by the liquid-phase-epitaxy method wherein the contacting temperatures are 850° C., 780° C., and 700° C., respectively. The period and the depth of the corrugation are 3,500 A and 600 A. As is apparent from FIGS. 10, 11 and 12; when the contacting temperature is 850° C., the corrugation vanished completely from the surface of the GaAs crystal; when the contacting temperature is 780° C., the corrugation is still remained, but is transfigured so much; and when the contacting temperature is 700° C., that is a present invention, the corrugation is remained in the almost same condition as the original corrugation. Therefore, the present invention is very efficient for obtaining the semiconductor layer on the periodically corrugated surface of the semiconductor crystal when compared with the conventional liquid-phase-epitaxy method.

Figure 13:
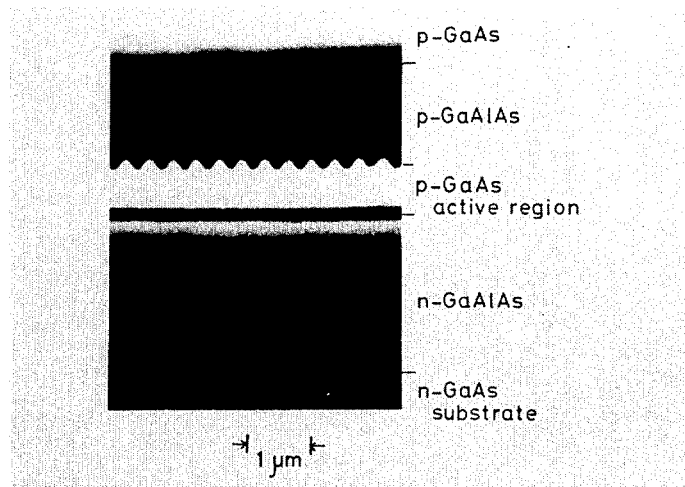
FIG. 13 is a photomicrograph of a cross-section of a semiconductor device obtained by the present invention.

FIG. 13 is a photomicrograph of a cross-section of the semiconductor device as shown in FIG. 8. As is apparent from FIG. 13, at the interface of GaAs crystal and GaAlAs layer, a periodic corrugation is maintained.

As described above, according to the present invention, it becomes possible to maintain a periodic corrugation at the interface between the semiconductor crystal and the semiconductor layer, whereby not only the distributed feedback lasers, but also other semiconductor devices having a periodic corrugation at the interface between the semiconductor crystal and the semiconductor layer are easily and accurately fabricated.

While the present invention has been described by reference to particular embodiments thereof, it will be understood that numerous and further modifications may be made by those skilled in the art without actually departing from the present invention. We, therefore, aim in the appended claims to cover all such equivalent variation as comes within the true spirit and scope of the foregoing disclosure.

What is claimed is:

1. A method for fabricating a semiconductor device having a periodic corrugation at an interface between a GaAs crystal and a GaAlAs layer comprising the steps of:

preparing a GaAs crystal;

selectively etching the surface of said GaAs crystal, to form a periodic corrugation on the surface of said GaAs crystal;

preparing a solution including Ga, Al and As therein;

heating said solution to a temperature within a range between 650° C and 750° C;

contacting said heated solution onto said periodically corrugated surface of said GaAs crystal; and cooling said solution at a cooling rate between 1° C/min. and 10° C/min.

2. A method according to claim 1, wherein the cooling rate is within a range between 1° C/min and 5° C/min.

3. A method for fabricating a semiconductor device having a periodic corrugation at an interface between a GaAs crystal and a GaAlAs layer comprising the steps of:

preparing a GaAs crystal;

selectively etching the surface of said GaAs crystal to form a periodic corrugation on said surface;

preparing a solution including Ga, Al and As therein;

heating said solution to a temperature higher than a temperature between 650° C and 750° C;

cooling said solution at a cooling rate between 1° C/min and 10° C/min;

contacting said solution onto the periodically corrugated surface of said GaAs crystal, when the temperature of said solution is within a range between 650° C and 750° C; and further cooling said solution at a cooling rate between 1° C/min and 10° C/min.

4. A method according to claim 3, wherein the cooling rates of said cooling step and further cooling step are within a range between 1° C/min and 5° C/min.

5. A method according to claim 3, wherein the cooling rates of said cooling step and further cooling step are equal to each other.

6. A method for fabricating a semiconductor device having a periodic corrugation at an interface between a GaAs crystal and a GaAlAs layer comprising the steps of:
preparing a plurality of contiguous semiconductor layers which are disposed on a semiconductor body, and which have a surface layer consisting a GaAs crystal;
selectively etching the surface of said GaAs crystal to form a periodic corrugation on said surface;
preparing a solution including Ga, Al, and As therein;
heating said solution to a temperature higher than a temperature between 650° C and 750° C;
cooling said solution at a cooling rate between 1° C/min and 10° C/min;
contacting said solution onto said periodically corrugated surface of said GaAs crystal, when the temperature of said solution is between 650° C and 750° C;
further cooling said solution at a cooling rate between 1° C/min and 10° C/min, whereby a GaAlAs layer is formed on the periodically corrugated surface of said GaAs crystal; and
forming first and second metal layers on said semiconductor body and on said GaAlAs layer, respectively.

7. A method according to claim 6, which further comprises the step of forming a second GaAs layer on said GaAlAs layer, and wherein said second metal layer is formed on said second GaAs layer.

8. A method according to claim 6, wherein the cooling rates of said cooling step and further cooling step are within a range between 1° C/min and 5° C/min.

9. A method according to claim 6, wherein the cooling rates of said cooling step and further cooling step are equal to each other.

* * * * *